US009459290B2

(12) United States Patent
Johnson et al.

(10) Patent No.: US 9,459,290 B2
(45) Date of Patent: Oct. 4, 2016

(54) OSCILLOSCOPE SYSTEM AND METHOD FOR SIMULTANEOUSLY DISPLAYING ZOOMED-IN AND ZOOMED-OUT WAVEFORMS

(71) Applicant: Keysight Technologies, Inc., Minneapolis, MN (US)

(72) Inventors: Kenneth W. Johnson, Colorado Springs, CO (US); Edward Vernon Brush, IV, Colorado Springs, CO (US); Michael T. McTigue, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 828 days.

(21) Appl. No.: 13/873,955

(22) Filed: Apr. 30, 2013

(65) Prior Publication Data

US 2014/0320145 A1    Oct. 30, 2014

(51) Int. Cl.
G01R 13/00    (2006.01)
G01R 31/36    (2006.01)
G01R 13/02    (2006.01)
G01R 19/25    (2006.01)

(52) U.S. Cl.
CPC ........... *G01R 13/0236* (2013.01); *G01R 19/25* (2013.01)

(58) Field of Classification Search
None
See application file for complete search history.

(56) References Cited

U.S. PATENT DOCUMENTS

| | | | | |
|---|---|---|---|---|
| 4,972,138 A * | 11/1990 | Bush | ...................... | G06F 11/25 324/121 R |
| 6,229,536 B1 * | 5/2001 | Alexander | ........... | G01R 13/345 345/440 |
| 6,502,045 B1 * | 12/2002 | Biagiotti | ................ | H04N 17/00 345/418 |
| 6,559,868 B2 * | 5/2003 | Alexander | ........... | G01R 13/345 345/440.1 |
| 6,642,926 B1 | 11/2003 | Letts | | |
| 7,443,396 B2 * | 10/2008 | Ilic | ......................... | G01R 13/02 345/440 |
| 8,040,125 B2 | 10/2011 | Kuhwald et al. | | |
| 9,188,606 B2 * | 11/2015 | Johnson | ............. | G01R 1/06788 |
| 9,316,669 B2 * | 4/2016 | McTigue | ........... | G01R 1/06788 |
| 2002/0063712 A1 * | 5/2002 | Ilic | ......................... | G01R 13/02 345/440 |
| 2003/0043757 A1 | 3/2003 | White | | |
| 2004/0243935 A1 | 12/2004 | Abramovitch | | |

(Continued)

OTHER PUBLICATIONS

Eduardo Casilari et al. "Modeling of Current Cosumption in 802.15.4/ZigBee Sensor Motes", Sensors 2010, vol. 10, pp. 5443-5468.

(Continued)

*Primary Examiner* — Jarmele M Hollington
*Assistant Examiner* — Suresh K Rajaputra (57) ABSTRACT

An oscilloscope system includes a current probe, a processing unit and a display unit. The current probe includes a high and low gain signal paths for receiving simultaneously a signal of interest from a device under test (DUT), and to output amplified small and large current portions of the signal of interest, respectively. The processing unit receives first and second digitized data corresponding to the amplified small and large current portions output by the high and low gain signal paths, respectively, and processes the first and second digitized data for display as zoomed-in and zoomed-out waveform data, respectively. The display unit displays simultaneously a zoomed-in waveform in a first display window, based on the zoomed-in waveform data, and a zoomed-out waveform in a second display window, based on the zoomed-out waveform data, using the same time scale. The small current portion is less than a predetermined threshold.

20 Claims, 4 Drawing Sheets

(56) References Cited

U.S. PATENT DOCUMENTS

| | | |
|---|---|---|
| 2005/0080831 A1 | 4/2005 | Pickerd et al. |
| 2005/0234670 A1* | 10/2005 | Hagen ............... G01R 13/206 702/85 |
| 2009/0079408 A1 | 3/2009 | Qiao et al. |
| 2010/0063760 A1 | 3/2010 | Rule et al. |
| 2010/0131220 A1* | 5/2010 | Beck ................. G01R 13/029 702/67 |
| 2011/0166813 A1 | 7/2011 | Kelly |
| 2011/0215655 A1 | 9/2011 | Rondeau |
| 2012/0197598 A1* | 8/2012 | Dobyns ............. G01R 13/029 702/189 |
| 2013/0044134 A1* | 2/2013 | Waldo ............... G01R 13/029 345/660 |

OTHER PUBLICATIONS

Co-pending U.S. Appl. No. 13/869,774, filed Apr. 24, 2013.

* cited by examiner

OSCILLOSCOPE SYSTEM AND METHOD FOR SIMULTANEOUSLY DISPLAYING ZOOMED-IN AND ZOOMED-OUT WAVEFORMS

BACKGROUND

Many battery powered devices, such as cell phones, tablets, ebook readers, and the like, have one or more intermediated active states and a sleep (or hibernate) state for conserving battery power. The sleep state typically draws significantly less current than the active states. For example, a cell phone may draw about 500 uA while powered down in a sleep state and about 2 A while transmitting in a communication state. Designers of such battery powered devices generally attempt to maximize battery life. In order to accurately test designs, the different currents must be measured while the battery powered devices operate in the various different states. However, displays of conventional oscilloscopes have resolution limitations that prevent useful, simultaneous display of small current portions of the signals in the sleep state and large current portions of the signals in the communication state.

For example, a cell phone may have three states: a sleep state (low power state) in which the cell phone is not being actively used, but is still powered on and ready to receive calls or data in response to wake-up commands; a chores state (intermediate power state) in which the cell phone is performing housekeeping functions, such as checking for appointments, refreshing statuses of applications, checking battery level and receiving status updates from hardware, but is not actively transmitting or receiving calls; and a communication state (high power state) in which the cell phone is actively transmitting or receiving, such as transmitting or receiving calls or "checking in" with base stations to provide status or location information. Typically, such a cell phone draws current on the order of microamps (e.g., 500 μA) in the sleep state, on the order of milliamps (e.g., 1 mA) in the chores state, and on the order of amps (e.g., 2 A) in the communication state. Due to the large differences in current among the various states and resolution limitations of an oscilloscope display, the current signals cannot be displayed and/or measured using the same oscilloscope display. For example, if peak current indicated by a large current portion of the signal waveform (e.g., in the communication state) observed from the cell phone is 2 A, and the oscilloscope is set to the optimum setting for the channel providing the large current portion of the signal, the displayed signal waveform will fill the display screen. Assuming the oscilloscope has eight bits of resolution, the minimum level that may be observed on the oscilloscope display is greater than 8 mA (i.e., $2 A/2^8 = 8$ mA). Therefore, a small current portion of the signal waveform (e.g., in the sleep state) will be in the noise on the displayed signal waveform.

SUMMARY

In a representative embodiment, an oscilloscope system includes a current probe, a processing unit and a display unit. The current probe includes a high gain signal path and a low gain signal path configured to receive simultaneously a signal of interest from a device under test (DUT) and to output an amplified small current portion of the signal of interest and an amplified large current portion of the signal of interest, respectively. The processing unit is configured to receive first digitized data corresponding to the amplified small current portion of the signal of interest output by the low gain signal path and second digitized data corresponding to the amplified large current portion of the signal of interest output by the low gain signal path, to process the first digitized data for display as zoomed-in waveform data, and to process the second digitized data for display as zoomed-out waveform data. The display unit is configured to display simultaneously a zoomed-in waveform in a first display window, based on the zoomed-in waveform data, and a zoomed-out waveform in a second display window, based on the zoomed-out waveform data, using the same time scale. The small current portion of the signal of interest is less than a predetermined threshold.

In another representative embodiment, a method is provided for processing data corresponding to a small current portion and a large current portion of a signal of interest provided from a DUT via a current probe. The method includes receiving the small current portion of the signal of interest amplified by a high gain signal path of the current probe via a first channel of an oscilloscope; receiving the large current portion of the signal of interest amplified by a low gain signal path of the current probe via a second channel of the oscilloscope substantially simultaneously to receiving the small current portion of the signal of interest; digitizing the received small current portion and the received large current portion of the signal of interest to provide first digitized data and second digitized data, respectively; selecting portions of the first digitized data that are less than a predetermined threshold; processing the selected portions of the first digitized data for display as zoomed-in waveform data; processing the second digitized data for display as zoomed-out waveform data; and displaying simultaneously a zoomed-in waveform in a first display window, based on the zoomed-in waveform data, and a zoomed-out waveform in a second display window, based on the zoomed-out waveform data, using the same time scale.

In another representative embodiment, an oscilloscope includes first and second channels, a processing unit and a display unit. The first channel is configured to receive a signal of interest output by a DUT in a sleep mode, and amplified to provide a small current portion of the signal of interest, the small current portion being less than a predetermined threshold. The second channel is configured to receive the signal of interest output by the DUT in a communication mode, and amplified to provide a large current portion of the signal of interest. The processing unit is configured to receive first digitized data corresponding to the amplified small current portion of the signal of interest from the first channel and second digitized data corresponding to the amplified large current portion of the signal of interest from the second channel, to process the first digitized data for display as zoomed-in waveform data, and to process the second digitized data for display as zoomed-out waveform data. The display unit is configured to display simultaneously a zoomed-in waveform in a first display window, based on the zoomed-in waveform data, and a zoomed-out waveform in a second display window, based on the zoomed-out waveform data, using the same time scale.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

In order to measure use of battery power by a device under test (DUT), a circuit designer must find the "area under the curve" of a signal waveform that represents current and time (e.g., coulombs). The signal waveform may be measured by an oscilloscope and a current probe, for example. According to various embodiments, a multipath current probe is used to provide a signal of interest on each of multiple signal paths having different gains. The signal of interest has large variations in current magnitude, as discussed above, such that the signal of interest may change between a small current signal portion (on the scale of micro amps) and a large current portion (on the scale of amps) corresponding to different states of the DUT, such as a sleep state (low power state) and a communication state (high power state), respectively. For example, the current probe may have two signal paths, a high gain signal path and a low gain signal path, configured to receive simultaneously the signal of interest. The high gain signal path is substantially optimized to amplify the small signal portion of the signal of interest and the low gain signal path is substantially optimized to amplify the large signal portion of the signal of interest, so that both the amplified small and large signal portions are within a range measurable and displayable by the oscilloscope. For example, the high gain signal path provides significant amplification of the signal of interest to capture the small signal portion (e.g., about 500 uA), which may be displayed as a "zoomed-in waveform." The low gain signal path provides relatively little or no amplification of the signal of interest to capture the large signal portion (e.g., about 2 A), which may be displayed as a "zoomed-out waveform." Amplified small and large current portions from both the low gain and high gain signal paths, respectively, are presented to the oscilloscope via separate channels to which corresponding outputs of the current probe are connected. Corresponding zoomed-in and zoomed-out waveforms may be displayed simultaneously in corresponding sections (e.g., first and second windows) of the oscilloscope display. The small current portion may be that portion of the signal of interest below a predetermined threshold, while the large current portion may be that portion of the signal of interest above the predetermined threshold, for example.

Using this data, the oscilloscope is able to measure the area under the curve of the zoomed-in waveform corresponding to the small current portion and the area under the curve of the zoomed-out waveform corresponding to the large current portion, and to add the areas under the curves, while excluding data from a duplicate area of the zoomed-out waveform corresponding to the zoomed-in waveform. That is, data priority is given to the zoomed-in waveform because it has less offset error, better signal to noise ratio (SNR) and high sensitivity. Notably, this duplicate area would otherwise be in the noise of the zoomed-out waveform, and therefore would not provide an accurate measure of the battery power consumed in the sleep state. By subtracting out the duplicate area of the zoomed-out waveform and adding in the zoomed-in waveform, which represents the duplicate area of the zoomed-out waveform, a measurement of the entire current signal of interest can be made that no single channel could otherwise provide.

Figure 1:
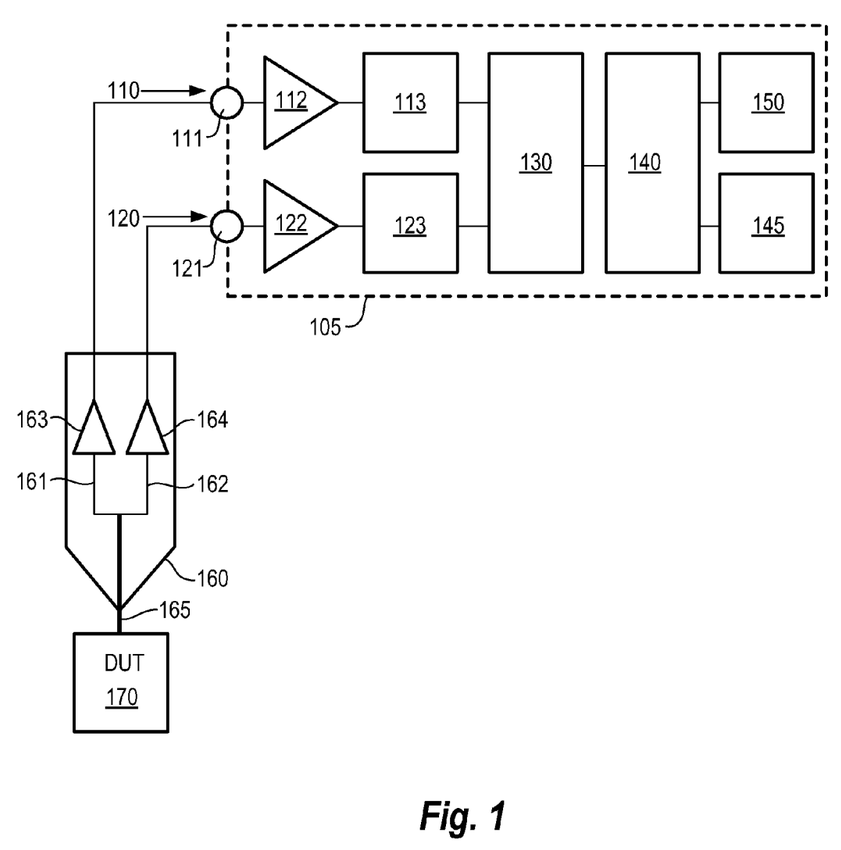
FIG. 1 is a simplified block diagram of an oscilloscope system, including a multipath current probe, according to a representative embodiment.

FIG. 1 is a simplified block diagram of an oscilloscope system, according to a representative embodiment.

Referring to FIG. 1, oscilloscope system 100 includes oscilloscope 105 and current probe 160. The current probe 160 is a multipath current probe, which provides a high gain signal path 161 having corresponding high gain amplifier 163 and a low gain signal path 162 having corresponding low gain amplifier 164. In an embodiment, the low gain signal path 162 may have no amplifier. The high gain amplifier 163 may be a higher gain differential amplifier with lower bandwidth to enhance or optimize low current level SNR, and the low gain amplifier 164 may be a lower gain differential amplifier with moderate bandwidth. Each of the high gain amplifier 163 and the low gain amplifier 164 may comprise single or multiple stage amplifiers. The current probe 160 receives a signal of interest from a DUT 170 via a single probe tip 165, and the signal of interest is split between the high and low gain signal paths 161 and 162. The high gain signal path 161 is configured (or substantially optimized) to amplify a small current portion of the signal of interest and the low gain signal path 162 is configured (or substantially optimized) to amplify a large current portion of the signal of interest simultaneously. The high gain signal path 161 has a relatively large gain and a limited bandwidth which greatly improves the SNR for measuring very small currents.

Due to the significant differences in current levels of the different states of a battery powered device, the high gain signal path 161 has substantially higher gain than the low gain signal path 162. For example, the high gain signal path 161 may have a gain of about 300:1, and the low gain signal path 162 may have a gain of about 2:1, although other gains and/or relative gains may be implemented without departing from the scope of the present teachings. The respective gains are determined such that both the amplified small current signal output by the high gain signal path 161 and the amplified large current signal output by the low gain signal path 162 are within the display range of the oscilloscope 105. That is, the gain level of each of the high gain signal path 161 and the low gain signal path 162 is selected based on the anticipated maximum and minimum signal levels to be observed. The high gain signal path 161 therefore must have enough gain to provide an acceptable signal to noise ratio for the small current portion of the signal of interest. The low gain signal path 162 is set so that the largest signal of the large current portion of the signal of interest will not exceed the input range of the oscilloscope while still providing enough signal to noise ratio so as to be able to measure signals that are not covered by the high gain signal path 161. In other words, the gain for each of the high gain signal path 161 and the low gain signal path 162 is set so that there will not be a "blind" region between the two channels (a signal too large for the high gain signal path 161, but too small for the low gain signal path 162). In an embodiment, the high gain amplifier 163 and the low gain amplifier 164 may be adjustable to provide flexibility in accommodating different small and large current portions. An example of a multipath current probe with a dynamic range of about 20,000:1 is provided by U.S. patent application Ser. No. 13/869,774 to Brush IV et al., filed on Apr. 24, 2013, which is hereby incorporated by reference in its entirety.

The high and low gain signal paths 161 and 162 are connected to different channels of the oscilloscope 105. For example, the high gain signal path 161 may be connected to a first channel 110 at a first channel port 111, and the low gain signal path 162 may be connected to a second channel 120 at a second channel port 121. The first channel 110 is used for observing the small current portion of the signal of interest on a magnified scale ("zoomed in" scale) and the second channel 120 is used for observing the signal of interest on a broad scale ("zoomed out" scale). In an embodiment, a probe amplifier (not shown) in the current probe 160 may receive the signal of interest through a pair of probe leads connected to the DUT 170, and transmit the signal of interest to the respective first and second channels 110 and 120 through the high and low gain amplifiers 163 and 164, respectively. To prevent the first channel 110 from being overdriven or saturated by signals output through the high gain signal path 161, a clamping circuit may be placed at the output of the high gain amplifier 163, as discussed for example in U.S. patent application Ser. No. 13/869,774 to Brush IV et al., mentioned above. Also, in various embodiments, switching circuits may be added at the outputs of the high and low gain amplifiers 163 and 164 so the signal paths can be reversed, if desired. Additionally, switching circuits may be added so that the clamping circuit can be diverted, thus switching off the clamping behavior.

The first channel 110 includes representative first amplifier 112 and first analog-to-digital converter (ADC) 113 for sampling and digitizing the amplified small current portion output by the high gain signal path 161 to provide first digitized data. The second channel 120 includes representative second amplifier 122 and second ADC 123 for sampling and digitizing the amplified large current portion output by the low gain signal path 162 to provide second digitized data. Each of the first and second amplifiers 112 and 122 may be adjustable to provide various gains of the corresponding amplified small current portion and large current portion, respectively. The first and second oscilloscope channels 110 and 120 may be aligned in time (synchronized) with one another.

The oscilloscope 105 further includes acquisition memory unit 130, processing unit 140, input unit 145, and display unit 150. The acquisition memory unit 130 is configured to store the first and second digitized data output by the first and second ADCs 113 and 123, respectively. The memory unit 143 may be any suitable type of non-transitory, tangible computer readable medium that is writable readable, including random access memory (RAM), such as static RAM (SRAM), a disk drive, a CD, a DVD, a universal serial bus (USB) drive, and the like.

The processing unit 140 may be implemented using one or more processing devices, such as a processor, a microprocessor, a digital signal processor (DSP), one or more application specific integrated circuits (ASICs), one or more field programmable gate arrays (FPGAs), or combinations thereof, using software, firmware, hard-wired logic circuits, or combinations thereof. The processing unit 140 may have access to dedicated memory (not shown), comprising a non-transitory, tangible computer readable medium (examples of which are discussed above) for storing operating software, modules, data and algorithms for executing the various embodiments described herein. In an embodiment, the computer readable medium of the dedicated memory and/or the memory unit 143 may be RAM embedded as Block RAM in the FPGAs used to implement the processing unit 140.

The input unit 145 may include a keyboard, key pad, a track ball, a mouse, a touch pad or touch-sensitive display, and the like. The display unit 150 may include a flat panel, an LCD or other type display that is part of the oscilloscope 105, for example, to which the processing unit 140 provides display data via a DSP, a display memory and/or a display interface (not shown). Functionality of the input unit 145 and the display unit 150 may be combined in a graphical user interface (GUI), enabling various features such as entering data and instructions in fields and selecting portions of waveforms displayed on a screen of the display unit 150. In various alternative configurations, the display data may be provided to an external and/or remote display unit (not shown), or may be saved internally (e.g., in acquisition memory unit 130) and/or externally for analysis at a later time.

The processing unit 140 is configured to receive the first and second digitized data from the acquisition memory unit 130 (and/or from the first and second ADCs 113 and 123, respectively) corresponding to the amplified small current and large portions of the signal of interest, respectively. The processing unit 140 selects portions of the first digitized data that are less than a predetermined threshold, and processes the selected portions of the first digitized data for display by the display unit 150 as zoomed-in waveform data. For example, the predetermined threshold may be a maximum amplitude value set by a user of the oscilloscope system 100 using the input unit 145. Alternatively, the predetermined threshold may be set in the current probe 160 (e.g., using an adjustable clamping voltage, corresponding to the predetermined threshold, provided in the high gain signal path 161), in which case the first digitized data received by the processing unit 140 is already less than the predetermined threshold. The clamping voltage may be applied using a clamping circuit placed at the output of the high gain amplifier 163. Of course, even when a clamping voltage is used, the processing unit 140 may be configured to apply another predetermined threshold different from the predetermined threshold associated with the clamping voltage, in which case the lesser of the two predetermined threshold values is applied. The processing unit 140 processes the second digitized data for display by the display unit 150 as zoomed-out waveform data. The maximum amplitude value or the clamping voltage value provides an upper boundary of the selected portions of the first digitized data to be processed as the zoomed-in waveform data.

The display unit 150 is configured to display simultaneously a zoomed-in waveform based on the zoomed-in waveform data provided by the processing unit 140, and a zoomed-out waveform based on the zoomed-out waveform data, for example, using the same time scale so that the zoomed-in waveform and the zoomed-out waveform are aligned in time. According to various embodiments, the user is therefore able to see the small current portion that is being magnified (zoomed-in waveform) relative to the overall signal of interest, including the large current portion (zoomed-out waveform). The user is also able to chose what portion of the signal of interest to magnify and by how much. For example, referring to FIG. 3, which is a sample screen shot on the display unit 150, according to a representative embodiment, zoomed-in waveform 311 may be displayed in a first display window 310 at the bottom of a display screen 300 of the display unit 150, and zoomed-out waveform 321 may be displayed in a second display window 320 at the top of the display screen 300. The first display window 310 has a corresponding first range, where an upper value of the first range is defined by the predetermined threshold. Accordingly, portions of the large current signal exceeding the predetermined threshold are chopped off and thus not shown in the first display window 310. The second display window 320 has a corresponding second range, where an upper value of the second range is set so that a peak current of the large current signal, provided by the zoomed-out waveform 321, fits within the second display window 320. Of course, the positioning of the first and second display windows 310 and 320 may be altered, without departing from the scope of the present teachings. For example, the zoomed-in waveform 311 may be displayed in the first display window 310 at the top of the display screen 300, and zoomed-out waveform 321 may be displayed in the second display window 320 at the bottom of the display screen 300. Alternatively, the first and second display windows 310 and 320 may be displayed beside one another on the display screen 300.

Figure 3:
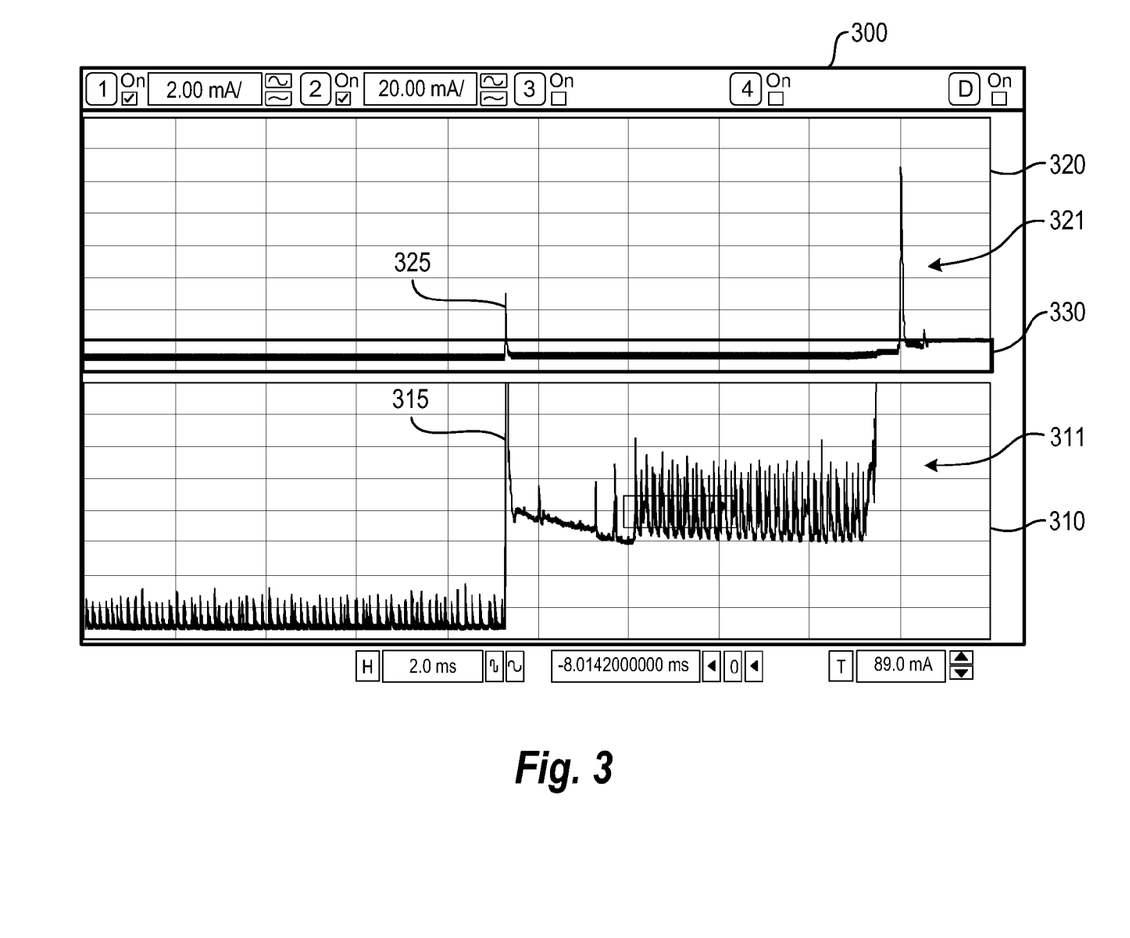
FIG. 3 is a sample screen shot on a display unit of an oscilloscope, simultaneously displaying zoomed-in and zoomed-out waveforms, according to a representative embodiment.

Also, the resolution of the first display window 310 is much greater than the resolution of the second display window 320, so that details of the small current portion of the signal of interest, provided by the zoomed-in waveform 311, are discernible. For example, where the second display window 320 may be scaled from 0 to 2 A at 8 mA intervals (as discussed above), the first display window 310 may be scaled from only 0 to 1 mA at 4 µA intervals. In this example, the 1 mA upper value of the first display window 310 corresponds to the predetermined threshold. Notably, due to the alignment in time, mentioned above, current spike 315 of the zoomed-in waveform 311 aligns with current spike 325 of the zoomed-out waveform 321, although the current spike 315 is chopped off since the upper value of the first display window 310 ends at the predetermined threshold.

In an embodiment, the predetermined threshold of the first display window 310 may be set using a selection window, e.g., which may be manipulated by the user on the display screen of the display unit 150. For example, the display screen 300 may display a selection window 330 in the second display window 320. The boundaries of the selection window 330 correspond to the boundaries of the first display window 310, such that the zoomed-in waveform 311 shown in the first display window 310 corresponds to the portion of zoomed-out waveform 320 depicted within the selection window 330. The boundaries of the selection window 330 may be adjustable by the user via the input unit 145. That is, the user may adjust (e.g., expand or contract) the upper and lower boundaries of the selection window 330 to adjust the respective upper and lower values of the first display window 310. In various embodiments, the upper boundary of the selection window 330 corresponds to the predetermined threshold corresponding to the maximum small current portion of the signal of interest to be displayed. The display unit 150 automatically adjusts the scale of the first display window 310 to accommodate the boundaries of the selection window 330. As shown in the example of FIG. 3, the selection window 330 has been sized to capture the portion of the zoomed-out waveform 321 that otherwise appears as noise.

The processing unit 140 is further configured to measure battery drain of the DUT 170 based on the zoomed-in waveform data and the zoomed-out waveform data. For example, the processing unit 140 may effectively measure a first area under the zoomed-in waveform 311 and a second area under the zoomed-out waveform 321, and add the first and second areas, less a duplicated area of the zoomed-out waveform 321 corresponding to the zoomed-in waveform 311, to obtain a total area under the curve. In the depicted example, the duplicated area of the zoomed-out waveform 321 corresponds the portion of the zoomed-out waveform 321 included in the selection window 330. The total area under the curve corresponds to the battery drain of the DUT 170, resulting from both the small signal current in sleep mode and the large signal current in the communication mode.

Figure 2:
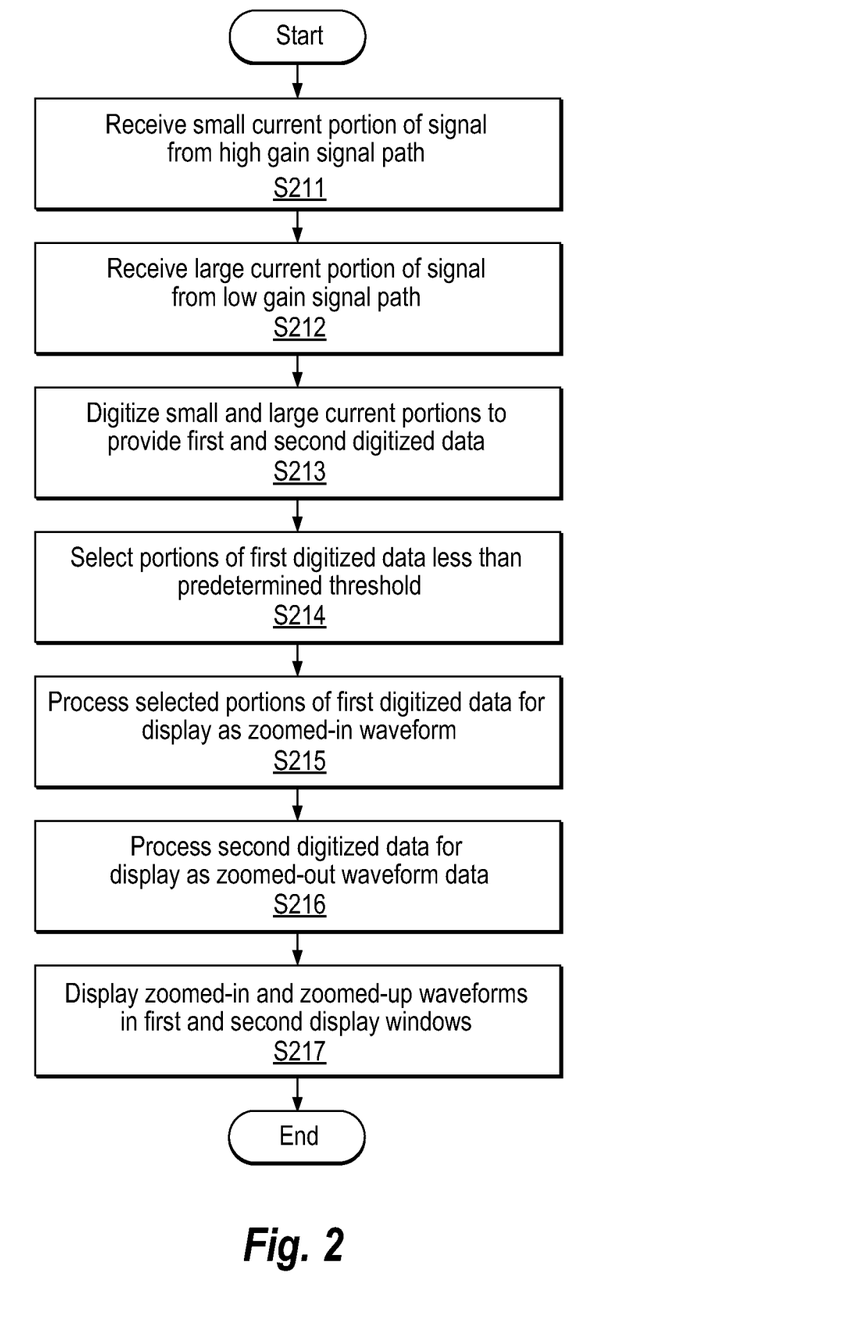
FIG. 2 is a flow diagram showing a process implemented by an oscilloscope system, including a multipath current probe, according to a representative embodiment.

FIG. 2 is a flow diagram showing a method of processing data corresponding to small and large current portions of a signal of interest provided from a DUT via a current probe, according to a representative embodiment.

Referring to FIG. 2, a small current portion of the signal of interest is received from a high gain signal path 161 of current probe 160 via a first channel 110 of an oscilloscope 105 in block S211, and a large current portion of the signal of interest is received from a low gain signal path 162 of the current probe 160 via a second channel 120) of the oscilloscope 105 substantially simultaneously with receiving the small current signal in block S212. In block S213, the small current portion and the large current portion are digitized by respective first and second ADCs 113 and 123 to provide first digitized data and second digitized data, respectively.

In block S214, portions of the first digitized data that are less than a predetermined threshold are selected, where the predetermined threshold corresponds to the upper values of the small current portion that will be analyzed and displayed as a zoomed-in waveform. The selected portions of the first digitized data are processed in block S215 for display as zoomed-in waveform data. The second digitized data are processed in block S216 for display as zoomed-out waveform data. In block S217, a zoomed-in waveform is displayed in a first display window (e.g., first display window 310), based on the zoomed-in waveform data, and a zoomed-out waveform is displayed in a second display window (e.g., second display window 320), based on the zoomed-out waveform data, using the same time scale. As mentioned above, the predetermined threshold may be a maximum amplitude corresponding to an upper value or upper boundary of the first display window, and/or the predetermined threshold may be a clamping voltage value set in the high gain signal path 162 of the current probe 160 which corresponds to the upper value or upper boundary of the first display window, for example.

In an embodiment, the user may define a selection window (e.g., selection window 330) that is presented in the second display window, along with the zoomed-out waveform data. That is, the selection window is displayed in the second display window with the zoomed-out waveform. The selection window is defined by receiving boundaries of the selection window via input unit 145, where an upper boundary of the selection window corresponds to the predetermined threshold. For example, the boundaries may be received simply in response to the displayed selection window being moved within the second display window on the display screen and/or the size of the displayed selection window being changed. Alternatively, the boundaries may be received in response to numeric entries corresponding to upper and/or lower limits of the selection window. A first range of the first display window is adjusted based on the received boundaries of the selection window, so that the boundaries of the first display window substantially correspond to the boundaries of the selection window, except in a zoomed-in or magnified perspective.

Figure 4:
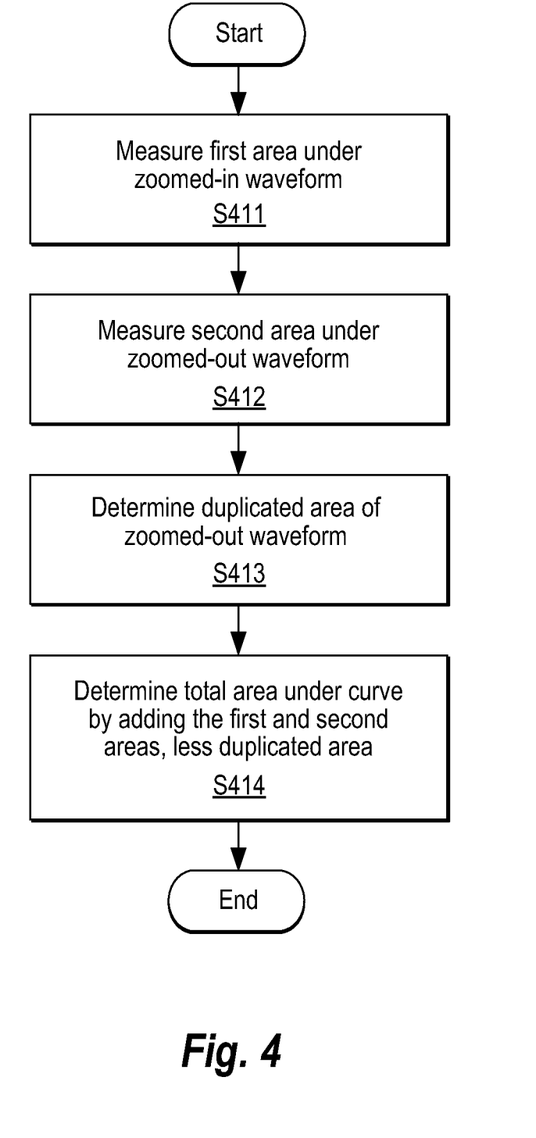
FIG. 4 is a flow diagram showing a method of determining power usage based on a small current portion and a large current portion of a signal of interest received via a current probe, according to a representative embodiment.

FIG. 4 is a flow diagram showing a method of determining power usage (e.g., battery drain) based on a small current portion and a large current portion of a signal of interest provided from a DUT via a current probe, according to a representative embodiment.

Referring to FIG. 4, a first area is measured under the zoomed-in waveform in block S411, and a second area is measured under the zoomed-out waveform in block S412. The first and second areas may be measured using the displayed zoomed-in and zoomed-out waveforms and/or the zoomed-in and zoomed-out waveform data. In block S413, a duplicated area in the zoomed-out waveform is determined, where the duplicated area corresponds to the first area (which is determined more accurately using the zoomed-in waveform). This is because the duplicated area merely appears as noise in the zoomed-out waveform and therefore provides no useful information. The duplicated area may be indicated visually as the portion of the zoomed-out waveform appearing within a selection window (e.g., selection window 330). In block S414, a total area under the curve is determined by adding the first area and the second area, less the duplicated area. The total area under the curve corresponds to battery drain of the DUT.

The various operations discussed above with reference to FIGS. 2 and 4 may be included, in whole or in part, in logic executable by a computer processor or other processing device, such as the processing unit 140, discussed above, and/or some combination of processing devices (e.g., by distributed processing). The operations may be implemented using internal logic or software, stored on a computer readable medium, and executable by one or more computer processors, ASICs, FPGAs or combinations thereof, as discussed above.

While the disclosure references illustrative embodiments, it will be apparent to those skilled in the art that various changes and modifications may be made without departing from the spirit and scope of the present teachings. Therefore, it should be understood that the above embodiments are not limiting, but illustrative.

What is claimed is:

1. An oscilloscope system comprising:
a current probe comprising a high gain signal path and a low gain signal path configured to receive simultaneously a signal of interest from a device under test (DUT) and to output an amplified small current portion of the signal of interest and an amplified large current portion of the signal of interest, respectively;
a processing unit configured to receive first digitized data corresponding to the amplified small current portion of the signal of interest by the low gain signal path and second digitized data corresponding to the amplified large current portion of the signal of interest output by the low gain signal path, to process the first digitized data for display as zoomed-in waveform data, and to process the second digitized data for display as zoomed-out waveform data; and
a display unit configured to display simultaneously a zoomed-in waveform in a first display window, based on the zoomed-in waveform data, and a zoomed-out waveform in a second display window, based on the zoomed-out waveform data, using the same time scale,
wherein the small current portion of the signal of interest is less than a predetermined threshold.

2. The oscilloscope system of claim 1, further comprising:
a first channel configured to receive the amplified small current portion of the signal of interest from the high gain signal path of the current probe; and
a second channel configured to receive the amplified large current portion of the signal of interest from the high gain signal path of the current probe,
wherein the processing unit receives the first digitized data via the first channel and the second digitized data via the second channel.

3. The oscilloscope system of claim 2, wherein the first and second oscilloscope channels are synchronized.

4. The oscilloscope system of claim 1, wherein the high gain signal path has a gain of about 300:1, and the low gain signal path has a gain of about 2:1.

5. The oscilloscope system of claim 1, wherein the predetermined threshold comprises a clamping voltage value set in the high gain signal path.

6. The oscilloscope system of claim 1, wherein the predetermined threshold comprises a maximum amplitude value set by the processing unit.

7. The oscilloscope system of claim 1, wherein the processing unit is further configured to measure battery drain of the DUT by measuring a first area under the zoomed-in waveform and a second area under the zoomed-out waveform, and adding the first and second areas, less a duplicated area of the zoomed-out waveform corresponding to the zoomed-in waveform, to obtain a total area corresponding to the battery drain.

8. The oscilloscope system of claim 1, wherein the display unit is further configured to display a selection window in the second display window, boundaries of the selection window corresponding to a range of the first display window.

9. The oscilloscope system of claim 8, wherein the boundaries of the selection window are adjustable via a user interface.

10. A method of processing data corresponding to a small current portion and a large current portion of a signal of interest provided from a device under test (DUT) via a current probe, the method comprising:
receiving the small current portion of the signal of interest amplified by a high gain signal path of the current probe via a first channel of an oscilloscope;
receiving the large current portion of the signal of interest amplified by a low gain signal path of the current probe via a second channel of the oscilloscope substantially simultaneously to receiving the small current portion of the signal of interest;
digitizing the received small current portion and the received large current portion of the signal of interest to provide first digitized data and second digitized data, respectively;
selecting portions of the first digitized data that are less than a predetermined threshold;

processing the selected portions of the first digitized data for display as zoomed-in waveform data;

processing the second digitized data for display as zoomed-out waveform data; and displaying simultaneously a zoomed-in waveform in a first display window, based on the zoomed-in waveform data, and a zoomed-out waveform in a second display window, based on the zoomed-out waveform data, using the same time scale.

11. The method of claim 10, further comprising:
receiving boundaries of a selection window via a user input unit, an upper boundary of the selection window corresponding to the predetermined threshold.

12. The method of claim 11, further comprising:
adjusting a first range of the first display window based on the received boundaries of the selection window; and displaying the selection window in the second display window with the zoomed-out waveform.

13. The method of claim 12, wherein the predetermined threshold comprises a maximum amplitude corresponding to an upper value of the first display window.

14. The method of claim 12, wherein the predetermined threshold comprises a clamping voltage set in the high gain signal path of the current probe corresponding to an upper value of the first display window.

15. The method of claim 10, further comprising:
measuring a first area under the zoomed-in waveform;
measuring a second area under the zoomed-out waveform;
determining a duplicated area in the zoomed-out waveform, the duplicated area corresponding to the first area under the zoomed-in waveform; and
determining a total area by adding the first and second areas, less the duplicated area, wherein the total area corresponds to battery drain of the DUT.

16. An oscilloscope comprising:
a first channel configured to receive a signal of interest output by a device under test (DUT) in a sleep mode, and amplified to provide a small current portion of the signal of interest, the small current portion being less than a predetermined threshold;

a second channel configured to receive the signal of interest output by the DUT in a communication mode, and amplified to provide a large current portion of the signal of interest;

a processing unit configured to receive first digitized data corresponding to the amplified small current portion of the signal of interest from the first channel and second digitized data corresponding to the amplified large current portion of the signal of interest from the second channel, to process the first digitized data for display as zoomed-in waveform data, and to process the second digitized data for display as zoomed-out waveform data; and a display unit configured to display simultaneously a zoomed-in waveform in a first display window, based on the zoomed-in waveform data, and a zoomed-out waveform in a second display window, based on the zoomed-out waveform data, using the same time scale.

17. The oscilloscope of claim 16, wherein the amplified small current portion is output by a high gain signal path and the amplified large current portion is output by a low gain signal path of a multipath current probe, the high gain signal path being configured to amplify the small current portion and the low gain signal path being configured to amplify the large current portion substantially simultaneously.

18. The oscilloscope of claim 16, wherein the first and second channels are synchronized.

19. The oscilloscope of claim 18, wherein the display unit is further configured to display a selection window in the second display window, boundaries of the selection window corresponding to a range of the first display window.

20. The oscilloscope of claim 19, wherein the boundaries of the selection window are adjustable via a user interface.

* * * * *